United States Patent
Kamori

(10) Patent No.: US 12,293,906 B2
(45) Date of Patent: May 6, 2025

(54) Mn—Ta—W—Cu—O-BASED SPUTTERING TARGET, AND PRODUCTION METHOD THEREFOR

(71) Applicant: Dexerials Corporation, Tokyo (JP)

(72) Inventor: Yuichi Kamori, Tokyo (JP)

(73) Assignee: Dexerials Corporation, Tokyo (JP)

( * ) Notice: Subject to any disclaimer, the term of this patent is extended or adjusted under 35 U.S.C. 154(b) by 751 days.

(21) Appl. No.: 17/276,627

(22) PCT Filed: Sep. 9, 2019

(86) PCT No.: PCT/JP2019/035389
§ 371 (c)(1),
(2) Date: Mar. 16, 2021

(87) PCT Pub. No.: WO2020/059560
PCT Pub. Date: Mar. 26, 2020

(65) Prior Publication Data
US 2021/0269910 A1 Sep. 2, 2021

(30) Foreign Application Priority Data
Sep. 19, 2018 (JP) .................... 2018-174712

(51) Int. Cl.
*C23C 14/34* (2006.01)
*C04B 35/495* (2006.01)
(Continued)

(52) U.S. Cl.
CPC ........ *H01J 37/3429* (2013.01); *C04B 35/495* (2013.01); *C22C 1/047* (2023.01);
(Continued)

(58) Field of Classification Search
CPC ............... H01J 37/3426; H01J 37/3429; H01J 37/3491; C23C 14/3414;
(Continued)

(56) References Cited

U.S. PATENT DOCUMENTS

2015/0132606 A1  5/2015  Kurokawa et al.
2018/0019109 A1  1/2018  Sugawara et al.
(Continued)

FOREIGN PATENT DOCUMENTS

JP   2016138312 A   8/2016
JP   6042520 B1 * 12/2016 ........... C04B 35/453
(Continued)

OTHER PUBLICATIONS

Machine Translation JP 6042520 (Year: 2016).*
(Continued)

*Primary Examiner* — Michael A Band
(74) *Attorney, Agent, or Firm* — Osha Bergman Watanabe & Burton LLP

(57) ABSTRACT

Provided is a Mn—Ta—W—Cu—O-based sputtering target including, in the component composition, Mn, Ta, W, Cu, and O. The sputtering target has a relative density of at least 90%, and includes a crystal phase of $Mn_4Ta_2O_9$. Also provided is a production method for the sputtering target.

8 Claims, 1 Drawing Sheet

X-RAY CRYSTAL STRUCTURE ANALYSIS (XRD)

(51) Int. Cl.
*C22C 1/047* (2023.01)
*C22C 30/00* (2006.01)
*G11B 7/243* (2013.01)
*H01J 37/34* (2006.01)

(52) U.S. Cl.
CPC .......... *C22C 30/00* (2013.01); *C23C 14/3414* (2013.01); *H01J 37/3491* (2013.01); *C22C 2200/00* (2013.01); *G11B 2007/2432* (2013.01)

(58) Field of Classification Search
CPC .... C04B 2235/3263; C04B 2235/3251; C04B 2235/3258; C04B 2235/3281; C04B 2235/3284; C04B 2235/404; C04B 2235/407; C04B 35/495
See application file for complete search history.

(56) References Cited

U.S. PATENT DOCUMENTS

| | | |
|---|---|---|
| 2018/0186699 A1 | 7/2018 | Sugawara et al. |
| 2019/0242009 A1 | 8/2019 | Sugawara et al. |
| 2019/0371360 A1 | 12/2019 | Tsuchino et al. |

FOREIGN PATENT DOCUMENTS

| | | |
|---|---|---|
| JP | 2017088932 A | 5/2017 |
| JP | 2018016837 A | 2/2018 |
| JP | 6377230 B1 | 8/2018 |
| WO | 2013183277 A1 | 12/2013 |
| WO | 2017159561 A1 | 9/2017 |
| WO | 2018155070 A1 | 8/2018 |

OTHER PUBLICATIONS

Cao, Yiming et al. "High-quality single crystal growth and magnetic property of Mn4Ta2O9" Journal of Crystal Growth, 2018, 492, p. 35-38 (4 pages).

International Search Report issued in International Application No. PCT/JP2019/035389, mailed Nov. 19, 2019 (5 pages).

Written Opinion issued in International Application No. PCT/JP2019/035389; Dated Nov. 19, 2019 (3 pages).

Office Action issued in Taiwanese Application No. 108133805, dated Jan. 5, 2023 (9 pages).

\* cited by examiner

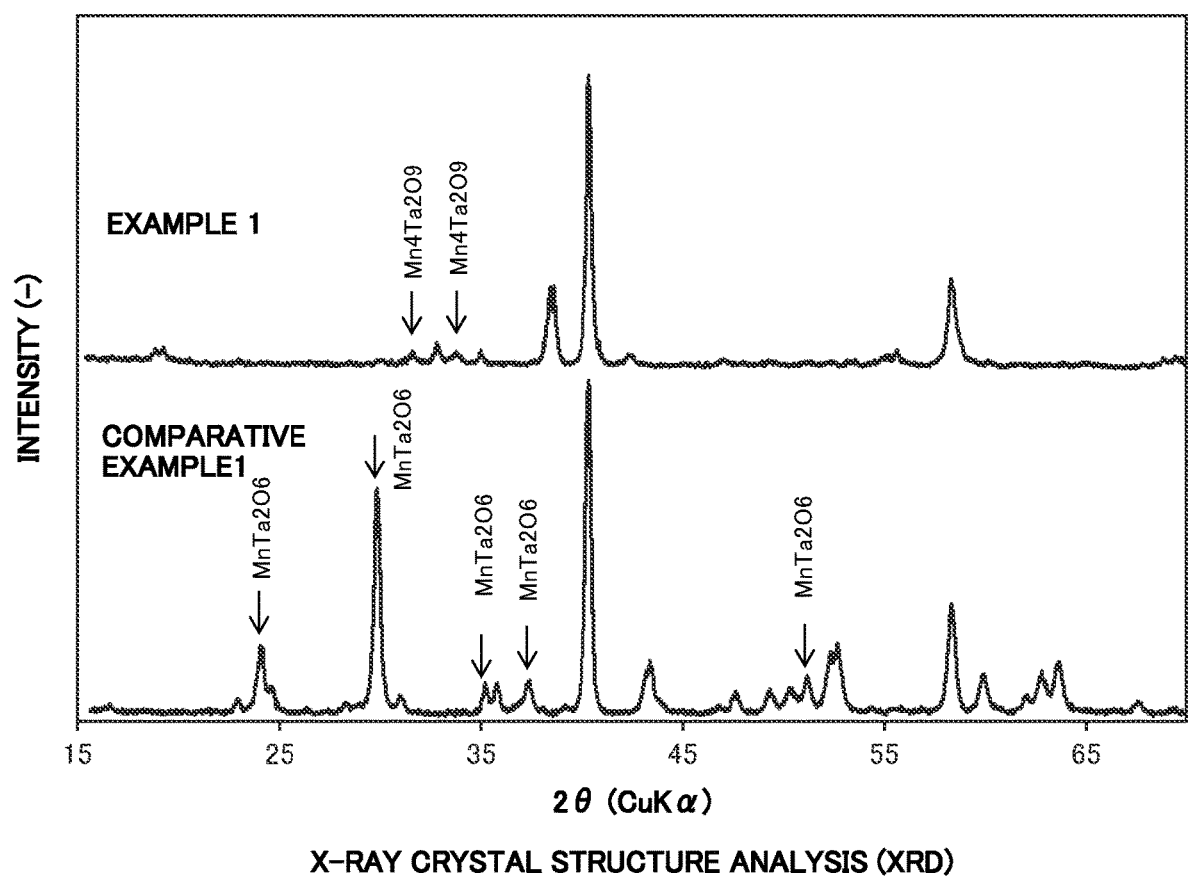

Mn—Ta—W—Cu—O-BASED SPUTTERING TARGET, AND PRODUCTION METHOD THEREFOR

TECHNICAL FIELD

The present invention particularly refers to a Mn—Ta—W—Cu—O-based sputtering target useful in the formation of a recording layer of an optical information recording medium, and a production method therefor.

BACKGROUND ART

In recent years, in the field of optical information recording media (optical disk), a capacity increase in optical disks has been required accompanying the increase in handled data, etc. Optical disks are classified into read only and recording type, and the recording type is further subdivided into the two types of write-once type and rewritable type. As the recording layer material of the write-once type, conventionally, organic dye materials have been widely considered; however, accompanying the capacity increases in recent years, inorganic materials have also come to be widely considered.

As a useful recording system established using inorganic materials, there is a recording method made utilizing the fact that the properties of the recording layer change by irradiating laser light on a recording layer containing an inorganic oxide having a low decomposition temperature, and accompanying this, the optical constant changes. As the inorganic oxide material, palladium oxide is being implemented. However, since Pd is a precious metal and the material cost is high, the development of a recording layer which can be implemented with inexpensive material cost in place of the palladium oxide has been desired.

As a recording layer for which sufficiently favorable recording characteristics can be obtained with an inexpensive material cost, a recording layer consisting of a manganese oxide-based material is being developed. For example, Patent Document 1 discloses a recording layer containing manganese oxide and a plurality of types of inorganic elements such as W, as well as a sputtering target used in order to form this recording layer.

Patent Document 1: PCT International Publication No. WO2013/183277

DISCLOSURE OF THE INVENTION

Problems to be Solved by the Invention

Herein, as the sputtering method for forming the recording layer consisting of the aforementioned manganese oxide and plurality of organic elements such as W, there is a multitarget sputtering method using a plurality of sputtering targets consisting of each element, and a method using one composite sputtering target containing a plurality of elements. Patent Document 1 discloses the multitarget sputtering method; however, since the device increases in size which is a cause for cost increase, there is a flaw in that compositional deviation tends to arise. For this reason, sputtering using one composite sputtering target is preferable. In addition, it is more desirable to use direct current (DC) sputtering than high frequency sputtering from the viewpoint of productivity.

However, in a composite sputtering target composed of manganese oxide and a plurality of inorganic elements such as W, insulating grains of $WMnO_4$ or the like tend to be included. With DC sputtering, since direct current voltage is applied to the composite sputtering target, in the case of sufficient conductivity not being obtained due to the influence of the insulating grains in the composite sputtering target, there is a risk of abnormal discharge (arcing) occurring. Damage is done to the recording film from abnormal discharge during deposition thereof, which becomes a cause for a decline in yield rate.

The present invention has been made taking account of the above, and has an object of providing a Mn—Ta—W—Cu—O-based sputtering target for which abnormal discharge is suppress upon subjecting to DC sputtering, and enables stable deposition, as well as a production method thereof.

Means for Solving the Problems

In order to achieve the above-mentioned object, the present invention provides a Mn—Ta—W—Cu—O-based sputtering target comprising Mn, Ta, W, Cu and O in a component composition, in which the sputtering target has a relative density of at least 90%, and contains a crystalline phase of $Mn_4Ta_2O_9$.

In the component composition, a proportion combining Ta and W may be less than 65 atom %, relative to a total of 100 atom % of constituent elements excluding O.

The sputtering target may further contain Zn in the component composition.

The sputtering target may further contain, in the component composition, at least one element selected from the group consisting of Mg, Ag, Ru, Ni, Zr, Mo, Sn, Bi, Ge, Co, Al, In, Pd, Ga, Te, V, Si, Cr and Tb.

The total content of the at least one element selected from the group consisting of Mg, Ag, Ru, Ni, Zr, Mo, Sn, Bi, Ge, Co, Al, In, Pd, Ga, Te, V, Si, Cr and Tb may be 8 atom % to 70 atom %, relative to a total of 100 atom % of constituent elements excluding O.

In addition, the present invention provides production method for the Mn—Ta—W—Cu—O-based sputtering target, the method comprising: wet mixing a mixed powder containing manganese-containing powder, a metal tantalum powder, a tungsten-containing powder and a copper-containing powder for at least 10 hours; and sintering the mixed powder at a temperature of 750° C. to 950° C. applying a pressure of at least 550 kgf/cm², after the step of wet mixing.

The manganese-containing powder may be manganese oxide powder, the tungsten-containing powder may be metal tungsten powder, and the copper-containing powder may be metal copper powder.

The mixed powder may further contain zinc oxide powder.

The mixed powder may further contain a powder consisting of a simple substance or compound of at least one element selected from the group consisting of Mg, Ag, Ru, Ni, Zr, Mo, Sn, Bi, Ge, Co, Al, In, Pd, Ga, Te, V, Si, Cr and Tb.

Effects of the Invention

According to the present invention, it is possible to provide a Mn—Ta—W—Cu—O-based sputtering target for which abnormal discharge is suppress upon subjecting to DC sputtering, and enables stable deposition, as well as a production method thereof.

BRIEF DESCRIPTION OF THE DRAWINGS

FIG. 1 is a graph showing the X-ray diffraction spectra of the sputtering targets according to Example 1 and Comparative Example 1.

PREFERRED MODE FOR CARRYING OUT THE INVENTION

Hereinafter, the present embodiment will be explained in detail.

(Mn—Ta—W—Cu—O-Based Sputtering Target)

A Mn—Ta—W—Cu—O-based sputtering target (hereinafter referred to simply as "target") according to the present embodiment contains Mn, Ta, W, Cu and O in the component composition, has a relative density of at least 90%, and contains a crystalline phase of $Mn_4Ta_2O_9$.

According to the target according to the present embodiment, upon subjecting to DC sputtering, abnormal discharge is suppressed, and stable deposition becomes possible.

The component ratio of the target according to the present embodiment is not particularly limited, and can be selected as appropriate according to the purpose. For example, relative to a total of 100 atom % of constituent elements excluding O (oxygen), Mn may be 5 atom % to 40 atom %, Ta may be 10 atom % to 35 atom %, W may be 5 atom % to 30 atom %, and Cu may be 5 atom % to 30 atom %.

In the target according to the present embodiment, relative to a total of 100 atom % of constituent elements excluding O (oxygen), the proportion combining Ta and W is preferably less than 65 atom %, may be less than 60 atom %, and may be less than 55 atom %. There is a tendency for being able to more easily adjust the relative density to at least 90% if the proportion combining Ta and W is less than 65 atom % than if being more than 65 atom %, relative to a total of 100 atom % of constituent elements excluding O. Although the lower limit is not particularly limited, the proportion combining Ta and W is preferably at least 25 atom % relative to a total of 100 atom % of constituent elements excluding O.

The target according to the present embodiment may contain Zn in the component composition. The component ratio has no particular limitation, and can be appropriately selected according to the purpose. For example, Zn may be 1 atoms to 35 atom % relative to a total of 100 atom % of constituent elements excluding O.

The target according to the present embodiment may contain other component compositions as necessary. By appropriately containing other elements, for example, in the case of using the target for recording layer formation of an information recording medium, it is possible to adjust the transmittance, reflectance and recording sensitivity of the recording layer. As other elements, at least one element selected from the group consisting of Mg, Ag, Ru, Ni, Zr, Mo, Sn, Bi, Ge, Co, Al, In, Pd, Ga, Te, V, Si, Cr and Td can be exemplified.

In the case of containing at least one element selected from the group consisting of Mg, Ag, Ru, Ni, Zr, Mo, Sn, Bi, Ge, Co, Al, In, Pd, Ga, Te, V, Si, Cr and Td, the content of the total thereof can be set as 8 atm % to 70 atom % relative to the total of 100% of constitutional elements excluding O, among the constituent elements of the target, for example.

In addition, the target according to the present embodiment contains a crystalline phase of $Mn_4Ta_2O_9$.

The crystalline phase contained in the target can be confirmed by X-ray diffractometry. Acquisition of the X-ray diffraction spectra of targets can be performed in accordance with a usual method. For example, using SmartLab manufactured by Rigaku Corp., the spectra may be obtained by θ-2θ scanning the target surface. The measurement conditions of X-ray diffraction are determined appropriately according to the target, and can be selected from within the range of the following conditions, for example, X ray source: Cu-Kα radiation
Output setting: 20 kV~100 kV, 10 mA~100 mA
Measurement angle range: 2θ=5°~80°
Scan rate: 1°~4° (2θ/min), continuous scanning
Divergence slit: 0.5°~2°
Scattering slit: 0.5°~2°
Light receiving slit: 0.1 mm~0.5 mm The diffraction peak of the main crystalline phase of the target is detected in the following range. Diffraction peak of $Mn_4Ta_2O_9$: 31.5°±0.3°

Diffraction peak of $MnTa_2OC$: 29.7°±0.3°
Diffraction peak of W: 40.26°±0.3°
Diffraction peak of MnO: 35.16°±0.3°, 40.99°±0.3°, 59.18° 10.3°
Diffraction peak of $MnWO_4$: 29.8°±0.3°, 30.23°±0.3°
Diffraction peak of ZnO: 36.3°±0.3°
Diffraction peak of Cu: 43.47°±0.3°, 50.67°±10.3°

As an index showing that the target according to the present embodiment is high density, the relative density shall be used in the present disclosure. The relative density of the target is at least 90%, and higher is more preferable.

It should be noted that relative density is the proportion of the measured density after sintering the raw material powder, relative to the virtual density in the case of calculating assuming that the raw material powder of the target filled 100%. In order to calculate the relative density, first, the dimensional measurement and weight measurement of the target are carried out, and then the measured density is calculated. Next, the relative density is calculated using the following formula. Relative density (%)=(measured density of sintered body/virtual density)×100

It should be noted that, the shape of the target according to the present embodiment is in no way limited, and can be established as any shape such as disk-shaped, cylindrical shaped, quadrilateral plate-shaped, rectangular plate-shaped, and square-plate shaped, and can be selected as appropriate according to the application of the target. In addition, regarding the size in width and depth of the target (diameter in the case of a circle), it is possible to select as appropriate according to the application of the target, within a range on the order of millimeter order to meter order. For example, in the case of the target being a circle, it is generally a diameter on the order of 50 mm to 300 mm. Although it is similar for thickness, the thickness is generally on the order of 1 mm to 20 mm.

In addition, the target is useful in the form of a recording layer of an optical information recording medium in particular; however, the application thereof is in no way limited.

(Production Method of Target)

Next, the production method of the target according to the present embodiment will be explained. The production method according to the present embodiment includes a mixing step and a sintering step.

First, in the mixing step, a mixed powder containing manganese-containing powder, a metal tantalum powder, a tungsten-containing powder and a copper-containing powder is wet mixed for at least 10 hours.

The manganese-containing powder can be appropriately selected according to the purpose, and powders consisting of a simple substance of compound of Mn can be exemplified. Thereamong, manganese oxides are preferable. As the manganese oxide, for example, it is possible to use $Mn_3O_4$, $Mn_2O_3$, MnO, $MnO_2$, $MnO_3$, $Mn_2O$, etc. These may be used independently, or may be jointly used as two or more types. Among the above-mentioned manganese oxides, $Mn_3O_4$ is preferable from the relationship between the sintering temperature and melting point. As the average particle size of the manganese-containing powder is not particularly limited, and can be set on the order of 3 μm to 15 μm, for example.

The average particle size of the metal tantalum powder is not particularly limited, and can be set on the order of 1 μm to 53 μm, for example.

The tungsten-containing powder can be appropriately selected according to the purpose, and metal tungsten powder consisting of a simple substance of W or the like can be exemplified, for example. The average particle size of the tungsten-containing powder is not particularly limited, and can be set on the order of 1 μm to 10 μm, for example.

The copper-containing powder can be appropriately selected according to the purpose, and metal copper powder consisting of a simple substance of Cu or the like can be exemplified. The average particle size of the copper-containing powder is not particularly limited, and can be set on the order of 1 μm to 50 μm, for example.

Zinc oxide powder may be contained in the above-mentioned mixed powder. As the zinc oxide powder, for example, ZnO can be used. The average particle size of the zinc oxide powder is not particularly limited, and can be set to on the order of 0.1 μm to 3 μm, for example.

In addition, according to the desired purpose of the produced target, another powder other than the above-mentioned manganese-containing powder, metal tantalum powder, tungsten-containing powder, copper-containing powder and zinc oxide powder may be contained in the mixed powder. As the other powder, for example, a powder consisting of a simple substance or compound of an element of at least one type selected from the group consisting of Mg, Ag, Ru, Ni, Zr, Mo, Sn, Bi, Ge, Co, Al, In, Pd, Ga, Te, V, Si, Cr and Tb can be exemplified.

As the method for wet mixing, there are no particularly limitations, and it is possible to appropriately select according to the purpose, and a wet mixing method using a conventional, known ball mill device can be exemplified.

The wet mixing time is set to at least 10 hours. By setting the mixing time to at least 10 hours, it is possible to sufficiently mix the mixed powder. In particular, in the case of using manganese oxide as the manganese-containing powder, the solid phase reaction of the manganese oxide during sintering is promoted, and leads to suppressing the residual crystalline phase of manganese oxide after sintering. The mixing time is preferably set to at least 12 hours, more preferably set to at least 16 hours, and even more preferably set to at least 20 hours. If mixing for 24 hours, the effect of mixing saturates.

Next, in the sintering step, the mixed powder is sintered at a temperature of 750° C. to 950° C. and pressure of at least 550 kgf/cm². It should be noted that 1 kgf/cm² corresponds to 98.1 kPa. The sintering method is not particularly limited, and it is possible to appropriately select according to the purpose, and hot pressing, hot isostatic pressing method (HIP method), etc. in an inert gas environment can be exemplified.

The pressure applied during sintering is sufficient so long as at least 550 kgf/cm². It is preferably at least 600 kgf/cm², more preferably at least 700 kgf/cm², and even more preferably at least 800 kgf/cm². Although it depends on other sintering conditions such as the component composition of the target, if setting the pressure during sintering to less than 550 kgf/cm², it becomes difficult to establish the relative density of the target as at least 90%.

The sintering temperature is sufficient so long as being 750° C. to 950° C., and may be 800° C. to 900° C.

The sintering time is not particularly limited and can be selected as appropriate, and is sufficient so long as setting to a sintering time on the order of 1 hour to 6 hours, as generally conducted.

It is possible to produce a Mn—Ta—W—Cu—O-based sputtering target by subjecting to the above steps, with a relative density of at least 90%, and containing a crystalline phase of $Mn_4Ta_2O_9$.

It should be noted that the production method according to the present embodiment may include other steps in addition to the above-mentioned mixing step and sintering step. As the other steps, for example, a molding step of the mixed powder carried out in order to form the shape of the sputtering target can be exemplified.

EXAMPLES

Next, examples of the present invention will be explained; however, the present invention is not to be limited to these examples.

(Production Method of Sputtering Target)

Example 1

In Example 1, the following powders were used as raw material powders. $Mn_3O_4$ powder (purity: 99.9% or higher, average particle size: 10 μm)

W powder (purity: 99.9% or higher, average particle size: 5 μm)

Ta powder (purity: 99.9% or higher, average particle size: 6 μm)

Cu powder (purity: 99.9% or higher, average particle size: 30 μm)

The above-mentioned raw material powders were weighed so that the proportion of each contained metal became Mn:W:Ta:Cu=25:30:25:20 (atom %). The respective weighted raw material powders, and the zirconia balls (5-mm diameter) of 0.5 times and ethanol of 0.5 times relative to the total weight of the respective raw material powder were charged into a container, and wet mixing was performed for 20 hours with a ball mill device. A sieve of 2 mm mesh was used to separate the zirconia balls from the slurry solution containing the above-mentioned mixed raw material powder. The slurry solution was heated to dry, and crushed using a sieve of 250 μm mesh to obtain the mixed powder. Next, a pressure of 800 kgf/cm² was applied for 2 hours with a sintering temperature of 850° C. on the above-mentioned mixed powder to perform hot pressing in an argon environment, thereby preparing the sputtering target. The shape of the sputtering target was a circular disk, and the size was 50 mm diameter.

Example 2

In Example 2, the following raw material powder was used in addition to the raw material powders used in Example 1. ZnO powder (purity: 99.9% or higher, average particle size: 2 μm) The raw material powders were weighed so that the proportion of each contained metal became Mn:W:Ta:Cu:Zn=20:30:25:15:10 (atom %), and a sputtering target was prepared by the same method as Example 1, except for setting the sintering temperature to 800° C.

Example 3

In Example 3, the raw materials were weighed using the same raw materials as Example 1, so that the proportion of each contained metal became Mn:W:Ta:Cu=25:25:25:25 (atom %), and the sputtering target was prepared by the same method as Example 1.

Example 4

In Example 4, the raw materials were weighed using the same raw materials as Example 1, so that the proportion of each contained metal became Mn:W:Ta:Cu=25:20:25:30 (atom %), and the sputtering target was prepared by the same method as Example 1.

Example 5

In Example 5, the raw materials were weighed using the same raw materials as Example 1, so that the proportion of each contained metal became Mn:W:Ta:Cu=30:20:20:30 (atom %), and the sputtering target was prepared by the same method as Example 1.

Example 6

In Example 6, the raw materials were weighed using the same raw materials as Example 2, so that the proportion of each contained metal became Mn:W:Ta:Cu:Zn=25:20:20:25:10 (atom %), and the sputtering target was prepared by the same method as Example 1, except for setting the sintering temperature to 800° C.

Example 7

In Example 7, the raw materials were weighed using the same raw materials as Example 1, so that the proportion of each contained metal became Mn:W:Ta:Cu=20:30:30:20 (atom %), and the sputtering target was prepared by the same method as Example 1.

Example 8

In Example 8, the raw materials were weighed using the same raw materials as Example 1, so that the proportion of each contained metal became the same as Example 1, and the sputtering target was prepared by the same method as Example 1, except for setting the sintering temperature to 800° C.

Example 9

In Example 9, the raw material powders were weighed using the same raw material powders as Example 1, so that the proportion of each contained metal became the same as Example 1, and the sputtering target was prepared by the same method as Example 1, except for setting the pressure during sintering to 600 kgf/cm$^2$.

Comparative Example 1

In Comparative Example 1, the following raw material powder was used in place of the Ta powder used in Example 1. Ta$_2$O$_5$ powder (purity: 99.9% or higher, average particle size: 4 μm)

The raw material powders were weighed so that the proportion of each contained metal became Mn:W:Ta:Cu=25:30:25:20 (atom %), and the sputtering target was prepared by the same method as Example 1, except for setting the sintering temperature to 1050° C., and setting the pressure during sintering to 500 kgf/cm$^2$.

Comparative Example 2

In Comparative Example 2, the following raw material powder was used in addition to the raw material powders used in Comparative Example 1. ZnO powder (purity: 99.9% or higher, average particle size: 2 μm)

The raw material powders were weighed so that the proportion of each contained metal became Mn:W:Ta:Cu:Zn=20:30:25:15:10 (atom %), and the sputtering target was prepared by the same method as Comparative Example 1.

Comparative Example 3

In Comparative Example 3, the raw material powders were weighed using the same raw material powders as Comparative Example 1, so that the proportion of each contained metal became Mn:W:Ta:Cu=20:30:35:15, and the sputtering target was prepared by the same method as Comparative Example 1.

Comparative Example 4

In Comparative Example 4, the raw material powders were weighed using the same raw material powders as Comparative Example 1, so that the proportion of each contained metal became Mn:W:Ta:Cu=20:30:30:20, and the sputtering target was prepared by the same method as Comparative Example 1.

Comparative Example 5

In Comparative Example 5, the raw material powders were weighed using the same raw material powders as Example 1, so that the proportion of each contained metal became Mn:W:Ta:Cu=20:30:35:15, and the sputtering target was prepared by the same method as Example 1.

Comparative Example 6

In Comparative Example 6, the raw material powders were weighed using the same raw material powders as Example 1, so that the proportion of each contained metal became the same as Example 1, and the sputtering target was prepared by the same method as Example 1, except for setting the pressure during sintering to 500 kgf/cm$^2$.

[Evaluation]

On the sputtering targets prepared in the above Examples 1 to 9 and Comparative Examples 1 to 6, measurement of the Ta-based composite oxide contained in the crystalline phase, relative density measurement and measurement of abnormal discharge number were performed. Each evaluation was performed as follows. The obtained evaluation results are shown in Table 1.

<Identification of Ta-Based Composite Oxide Contained in Crystalline Phase>

Identification of the Ta-base composite oxide contained in the crystalline phase of the sputtering target was performed by X-ray diffraction analysis. Upon X-ray diffraction, using SmartLab manufactured by Rigaku Corp., θ-2θ scanning was done to obtain the X-ray diffraction spectra. As a representative example, the X-ray diffraction spectra of the sputtering targets according to Example 1 and Comparative Example 1 are shown in FIG. 1. The test conditions were as follows. X-ray source: Cu-Kα radiation
  Output setting: 30 kV, 15 mA
  Measured angle range: 2θ=15°~70°
  Scan rate: 2° (2θ/min), continuous scan
  Divergence slit: 1°
  Scattering slit: 1°
  Light receiving slit: 0.3 mm
<Relative Density>

In order to calculate the relative density of the sputtering targets prepared in the above Examples 1 to 9 and Comparative Examples 1 to 6, dimensional measurement and weight measurement of the sputtering targets were carried out, and the measured density was calculated. Next, the relative density was calculated using the following formula. Relative density (%) (measured density of sintered body/virtual density of sintered body)×100
<Measurement of Abnormal Discharge Number>

The above Examples 1 to 9 and Comparative Examples 1 to 6 were adhered by In solder to a backing plate made from oxygen-free copper. These sputtering targets were installed in a sputtering device, and after performing evacuation until no more than $1\times10^{-4}$ Pa, Ar gas and $O_2$ gas were introduced to establish a device internal pressure of 0.3 Pa. The proportion of oxygen ($O_2$/Ar+$O_2$) was set to 70%. With a DC power source, 5 W/Cm² of electrical power was applied to perform sputtering for 30 minutes, and the number of abnormal discharges during sputtering was measured using an arcing counter.

prepared by entirely the same conditions except for the pressure during sintering, it was confirmed that there was a trend for the relative density to be higher with a higher pressure during sintering.

The invention claimed is:

1. A Mn—Ta—W—Cu—O-based sputtering target comprising:
   Mn, Ta, W, Cu and O in a component composition,
   wherein Mn is 5 atom % to 40 atom %, Ta is 10 atom % to 35 atom %, W is 5 atom % to 30 atom %, and Cu is 5 atom % to 30 atom %, and a proportion combining Ta and W is less than 65 atom %, relative to a total of 100 atom % of constituent elements excluding O, and
   wherein the sputtering target is a sintered component composition having a relative density of at least 90%, and contains a crystalline phase of $Mn_4Ta_2O_9$.

2. The sputtering target according to claim 1, further comprising Zn in the component composition.

3. The sputtering target according to claim 1, further comprising, in the component composition, at least one element selected from the group consisting of Mg, Ag, Ru, Ni, Zr, Mo, Sn, Bi, Ge, Co, Al, In, Pd, Ga, Te, V, Si, Cr and Th.

4. The sputtering target according to claim 3, wherein total content of the at least one element selected from the group consisting of Mg, Ag, Ru, Ni, Zr, Mo, Sn, Bi, Ge, Co, Al, In, Pd, Ga, Te, V, Si, Cr and Tb is 8 atom % to 70 atom %, relative to a total of 100 atom % of constituent elements excluding O.

TABLE 1

| | Metal element ratio (atom %) | | | | | Ta raw | Sintering conditions | | | Relative | Abnormal |
| | | | | | | | Temperature | Pressure | Ta-based | density | discharge |
| | Mn | W | Ta | Cu | Zn | Ta + W | material | (° C.) | (kgf/cm²) | complex oxide | (%) | number |
|---|---|---|---|---|---|---|---|---|---|---|---|---|
| Example 1 | 25 | 30 | 25 | 20 | 0 | 55 | Ta | 850 | 800 | $Mn_4Ta_2O_9$ | 95 | 0 |
| Example 2 | 20 | 30 | 25 | 15 | 10 | 55 | Ta | 800 | 800 | $Mn_4Ta_2O_9$ | 93 | 0 |
| Example 3 | 25 | 25 | 25 | 25 | 0 | 50 | Ta | 850 | 800 | $Mn_4Ta_2O_9$ | 98 | 0 |
| Example 4 | 25 | 20 | 25 | 30 | 0 | 45 | Ta | 850 | 800 | $Mn_4Ta_2O_9$ | 98 | 0 |
| Example 5 | 30 | 20 | 20 | 30 | 0 | 40 | Ta | 850 | 800 | $Mn_4Ta_2O_9$ | 99 | 0 |
| Example 6 | 25 | 20 | 20 | 25 | 10 | 40 | Ta | 800 | 800 | $Mn_4Ta_2O_9$ | 99 | 0 |
| Example 7 | 20 | 30 | 30 | 20 | 0 | 60 | Ta | 850 | 800 | $Mn_4Ta_2O_9$ | 91 | 0 |
| Example 8 | 25 | 30 | 25 | 20 | 0 | 55 | Ta | 800 | 800 | $Mn_4Ta_2O_9$ | 90 | 0 |
| Example 9 | 25 | 30 | 25 | 20 | 0 | 55 | Ta | 850 | 600 | $Mn_4Ta_2O_5$ | 91 | 0 |
| Comparative Example 1 | 25 | 30 | 25 | 20 | 0 | 55 | $Ta_2O_5$ | 1050 | 500 | $MnTa_2O_5$ | 97 | 40 |
| Comparative Example 2 | 20 | 30 | 25 | 15 | 10 | 55 | $Ta_2O_5$ | 1050 | 500 | $MnTa_2O_5$ | 97 | 50 |
| Comparative Example 3 | 20 | 30 | 35 | 15 | 0 | 65 | $Ta_2O_5$ | 1050 | 500 | $M_4Ta_2O_5$ | 95 | 70 |
| Comparative Example 4 | 20 | 30 | 30 | 20 | 0 | 60 | $Ta_2O_5$ | 1050 | 500 | $MnTa_2O_6$ | 96 | 40 |
| Comparative Example 5 | 20 | 30 | 35 | 15 | 0 | 65 | Ta | 850 | 800 | $Mn_4Ta_2O_9$ | 88 | 10 |
| Comparative Example 6 | 25 | 30 | 25 | 20 | 0 | 55 | Ta | 850 | 500 | $Mn_4Ta_2O_9$ | 88 | 10 |

From the above results, it was confirmed that a Mn—Ta—W—Cu—O-based sputtering target containing a crystalline phase of $Mn_4Ta_2O_9$ and having a relative density of at least 90% had a suppressed abnormal discharge number.

In addition, when comparing Examples 1, 5, 7 and Comparative Example 5 prepared using the same raw material powders and same sintering conditions, it was confirmed that there was a trend for the relative density to drop with higher fraction of Ta and W. Furthermore, when comparing Examples 1, 9 and Comparative Example 6 which were 5. A production method for the Mn—Ta—W—Cu—O-based sputtering target according to claim 1, the method comprising:
   wet mixing a mixed powder containing manganese-containing powder, a metal tantalum powder, a tungsten-containing powder and a copper-containing powder for at least 10 hours; and
   sintering the mixed powder at a temperature of 750° C. to 950° C. applying a pressure of at least 550 kgf/cm², after the step of wet mixing.

6. The production method according to claim 5, wherein the manganese-containing powder is manganese oxide powder, the tungsten-containing powder is metal tungsten powder, and the copper-containing powder is metal copper powder.

7. The production method according to claim 5, wherein the mixed powder further contains zinc oxide powder.

8. The production method according to claim 5, wherein the mixed powder further contains a powder consisting of at least one element selected from the group consisting of Mg, Ag, Ru, Ni, Zr, Mo, Sn, Bi, Ge, Co, Al, In, Pd, Ga, Te, V, Si, Cr and Th.

* * * * *